United States Patent [19]

Kimura et al.

[11] Patent Number: 5,584,061

[45] Date of Patent: Dec. 10, 1996

[54] RECEIVER WITH AUTOMATIC TUNING FUNCTION

[75] Inventors: Toshiyuki Kimura; Yutaro Ishikawa; Shinichi Abe; Kazuhiro Kamiya; Takashi Miyake, all of Kawagoe, Japan

[73] Assignee: Pioneer Electronic Corporation, Tokyo, Japan

[21] Appl. No.: 402,813

[22] Filed: Mar. 13, 1995

[30] Foreign Application Priority Data

Mar. 14, 1994 [JP] Japan .................................. 6-042862
Jan. 18, 1995 [JP] Japan .................................. 7-006042

[51] Int. Cl.$^6$ ..................................................... H04B 1/16
[52] U.S. Cl. .................................. 455/186.1; 455/161.3; 455/166.2
[58] Field of Search ........................... 455/186.1, 184.1, 455/185.1, 186.2, 181.1, 161.1, 161.2, 161.3, 166.1, 166.2, 77, 152.1, 345

[56] References Cited

U.S. PATENT DOCUMENTS

| | | | |
|---|---|---|---|
| 4,856,082 | 8/1989 | Kasa ........................................ | 455/161 |
| 5,086,511 | 2/1992 | Kabayashi et al. ..................... | 455/156 |
| 5,152,011 | 9/1992 | Schwob .................................. | 455/158.5 |
| 5,280,642 | 1/1994 | Hirata et al. ........................... | 455/186.1 |
| 5,307,513 | 4/1994 | Harada ................................... | 455/186.1 |

*Primary Examiner*—Reinhard J. Eisenzopf
*Assistant Examiner*—Lee Nguyen
*Attorney, Agent, or Firm*—Kane, Dalsimer, Sullivan, Kurucz, Levy, Eisele and Richard, LLP

[57] ABSTRACT

A receiver with automatic tuning function includes: unit for dividing an area where broadcasting stations exist into a plurality of blocks and storing block information relating to the blocks; unit for storing station information relating to each of the broadcasting stations located in the block in association with the block information of the block; unit for storing block information of a current block and blocks surrounding the current block; unit for selecting a broadcasting station out of the plurality of broadcasting stations located in the current block by referring to the station information associated with the block information of the current block; unit for receiving electric wave from the station selected; unit for judging receiving condition of the electric wave and outputting a judgement signal; and unit for renewing the current block.

5 Claims, 11 Drawing Sheets

| $G_{NW}$ | $G_N$ | $G_{NE}$ |
|---|---|---|
| $G_W$ | $G_C$ | $G_E$ |
| $G_{SW}$ | $G_S$ | $G_{SE}$ |

| G₁<br><br>a, b, c, d, e | G₂<br><br>f, g |
|---|---|
| G₃<br><br>h, i | G₄<br><br>j, k |

RECEIVER WITH AUTOMATIC TUNING FUNCTION

BACKGROUND OF THE INVENTION

1. Field of the Invention

This invention relates to a receiver with automatic tuning function, and more particularly to an improvement of current position renewal function of a receiver which is installed in a vehicle and automatically tunes to broadcasting stations by referring to information relating thereto (e.g., frequency, genre of broadcasting or name of broadcasting station) stored beforehand in the receiver.

2. Description of the Prior Art

Nowadays, FM broadcasting stations are increasing in number and broadcasting programs of stations are diversified. Some of stations broadcast some kind of music programs or news programs all day long. In United States abundant broadcasting stations exist, and a tendency of diversification in broadcasting program is markedly seen. Such a specialty in broadcasting program is referred to as "format", and information representing format of each broadcasting stations is referred to as "format information". To meet the above tendency in broadcasting business, it has been proposed a receiver which stores format information of each of broadcasting stations in advance, discriminates format information of broadcasting stations based on broadcasting frequencies and provides broadcasted information to user. Using this receiver, user can selectively tune to only stations of desired format. A receiver installed in a vehicle, such as car radio, receives radio waves rapidly and frequently varying in its condition from time to time, and therefore the above described tuning technique utilizing format information is significant.

Generally, a receiver utilizing format information (hereinafter referred to as "auto-tuning receiver") stores, in an internal memory, database relating to format information and station name information. The database includes state file, city file and grid file which are distributed to local areas. A concept "Grid" introduced for enabling easy search by the receiver is a small local block obtained by dividing local area supplied with broadcasting service into pieces of a given size. FIG. 1A illustrates a manner of defining grids. As shown, a local area is divided into a plurality of grids. A current grid in which receiver exists is represented by "X" and other grids surrounding the current grid "X" within search range of the receiver are represented by "A"–"H". A size of grid is determined, e.g., to be 30 km square, in accordance with a range of service areas of broadcasting stations and characteristics of vehicle (e.g., travelling speed). An auto-tuning receiver carries out the following operation called "format scan" to seek out a desired broadcasting station. Namely, the receiver varies reception frequency up and down, based on user's selection of format, to detect tunable stations from which signal can be received. Then, the receiver reads out format information corresponding to the detected station from the internal memory by referring to frequency information of the station. When format designated by user, such as "Jazz", is not coincident with format information of the detected station, the receiver seeks another station. When they are coincident with each other, the receiver terminates seek operation, reads out and displays station information, and continues signal reception from the station. Range of the seek by format scan may be limited within the current grid, or may be extended over other grids around the current grid.

In use of the above described auto-tuning receiver, user renews current grid according to movement of vehicle by manipulation of operation panel shown in FIG. 1B. By this, current position of vehicle is set and renewed. Thereafter, user can access to station information and format information in grid file by referring to reception frequency. For example, when signal receiving condition is deteriorated during movement of vehicle to north-east direction, user pushes buttons "N" and "E" on the operation panel to change the current grid from "X" to "C". In response, the receiver sets objective area of format scan to the nine grids including new current grid "C" at the center. The above described auto-tuning receivers are disclosed in Japanese Patent Applications Laid-Open Nos. Hei: 1-117529 and Hei:2-238723.

However, in the above described auto-tuning receiver, user has to manipulate the operation panel to renew current grid every time his vehicle goes out of service area of present broadcasting station. Generally, in such a case, user does not always recognize moving direction of his vehicle, and accordingly he should start operation with searching for correct current grid corresponding to actual location of his vehicle. Namely, user must search for a grid of best receiving condition by changing current grid and simultaneously examining receiving condition of new grid. This requires very complicated operation which is uncomfortable for user. Particularly, when vehicle is moving at high speed (e.g., running on highway), such a complicated renewal operation must be frequently carried out.

SUMMARY OF THE INVENTION

It is an object of the present invention to provide a receiver with automatic tuning function in which current position of vehicle is automatically renewed.

According to one aspect of the present invention, there is provided a receiver with automatic tuning function including: unit for dividing an area where broadcasting stations exist into a plurality of blocks and storing block information relating to the blocks; unit for storing station information relating to each of the broadcasting stations located in the block in association with the block information of the block; unit for storing block information of a current block and blocks surrounding the current block; unit for selecting a broadcasting station out of the plurality of broadcasting stations located in the current block by referring to the station information associated with the block information of the current block; unit for receiving electric wave from the broadcasting station selected; unit for judging receiving condition of the electric wave and outputting a judgement signal; and unit for renewing the current block. The renewing unit includes: unit for allowing the receiving unit to receive electric waves from all of the broadcasting stations located in the current block and the surrounding blocks and allowing the judging unit to output judgement signals for all of the broadcasting stations; and unit for detecting a block, out of the current block and the surrounding blocks, in best receiving condition based on the judgement signals and determining the block as new current block.

The nature, utility, and further features of this invention will be more clearly apparent from the following detailed description with respect to preferred embodiment of the invention when read in conjunction with the accompanying drawings briefly described below.

DESCRIPTION OF THE PREFERRED EMBODIMENT

A preferred embodiment of the present invention will be described below with reference to the accompanying drawings. The following description is directed to a radio receiver installed in a vehicle.

Figure 1A:
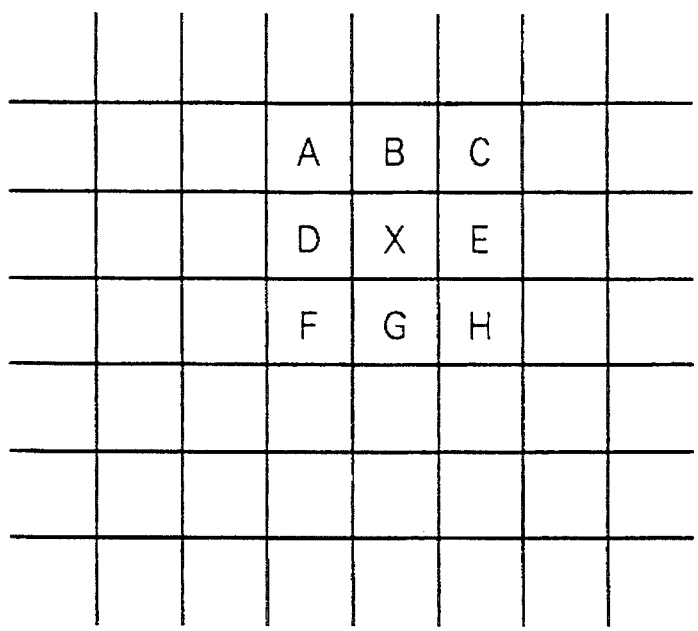
FIG. 1A is a diagram illustrating a manner of defining grids.
Figure 1B:
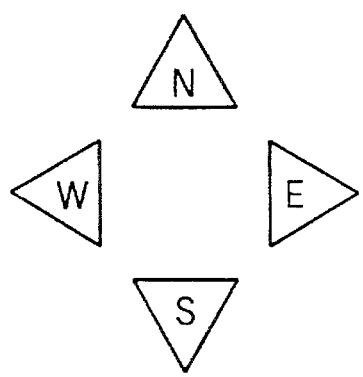
FIG. 1B is a diagram of an appearance of operation panel.
Figure 2:
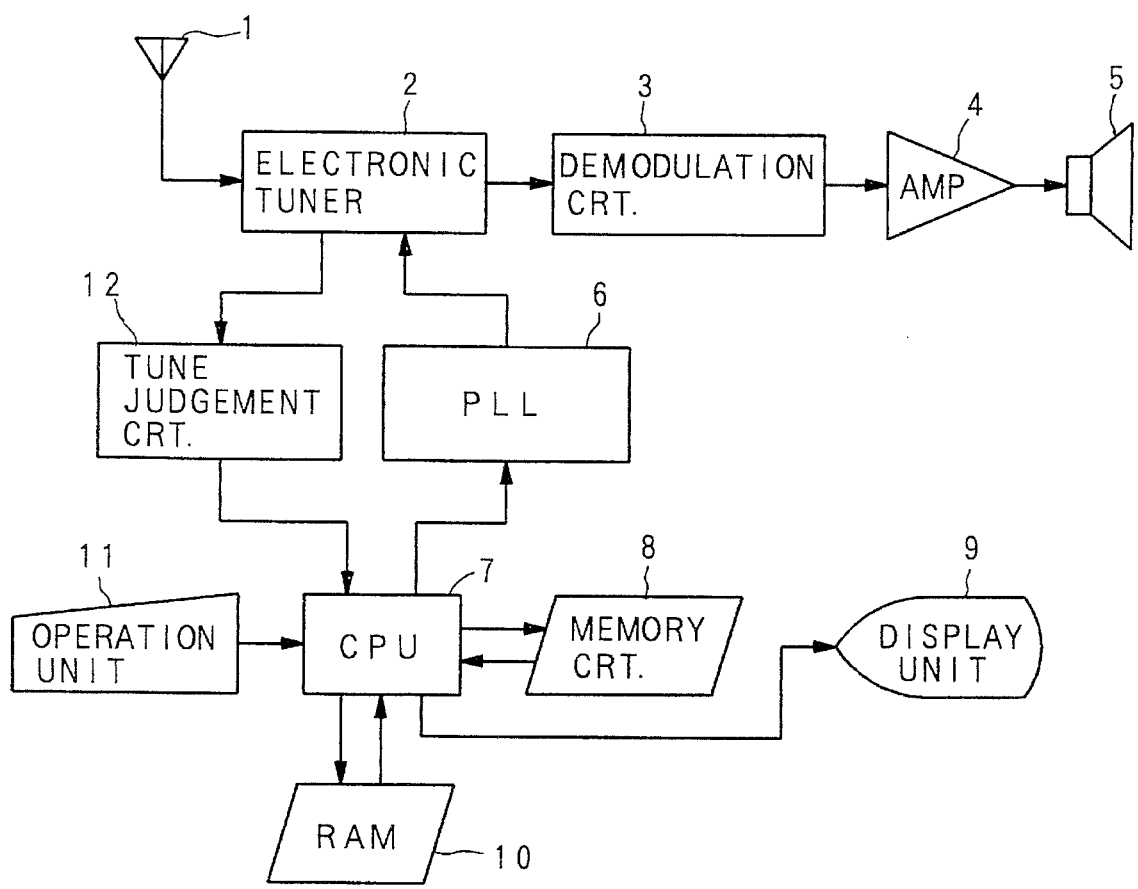
FIG. 2 is a block diagram illustrating a construction of auto-tuning receiver according to the present invention.

1st Embodiment:

FIG. 2 is a block diagram illustrating a construction of an auto-tuning receiver according to the present invention. As illustrated, the auto-tuning receiver includes an antenna 1, an electronic tuner 2, a demodulation circuit 3, an amplifier 4, a speaker 5, a PLL (Phase Locked Loop) circuit 6, a CPU 7, a memory circuit 8, a display unit 9, a RAM 10, an operation unit 11 and a tune judgement circuit 12. The antenna 1 receives radio waves from broadcasting stations and converts them into high-frequency electric signals. The electronic tuner 2 includes high-frequency amplifier, mixing circuit, local oscillator and IF (Intermediate Frequency) amplifier. The electronic tuner 2 tunes its reception frequency to a phase-lock frequency set by the PLL circuit 6, and outputs IF signal. The demodulation circuit 3 demodulates IF signal of selected broadcasting station and converts it into audio signal. The amplifier 4 performs power-amplification of the audio signal. The speaker 5 converts the audio signal into an acoustic sound and radiates it in driving room of the vehicle. The PLL 6 includes frequency synthesizer and VCO (Voltage Controlled Oscillator), and varies phase-lock frequency thereof under control of the CPU 7. The CPU 7 recognizes condition of internal memory and performs total control of the system by setting reception frequency, receiving input from the operation unit 11 and supplying necessary information to the display unit 9. The memory circuit 8 is constituted by ROM and stores frequency data of stations and station name data for every service areas in advance as well as necessary programs. The RAM 10 stores temporary information required for performance of the CPU 7 and pointer blocks required for reading out information from the memory circuit 8. The operation unit 11 receives data relating to grid or new broadcasting stations and basic operation information from user. The tune judgement circuit 12 judges whether radio wave from station has sufficient magnitude level or not. For example, during reception of a certain reception frequency f, the tune judgement circuit 12 allows judgement signal of the frequency f to be valid ("1" or "0") when levels of AGC and IF signal are higher than given levels, respectively.

Figure 4:
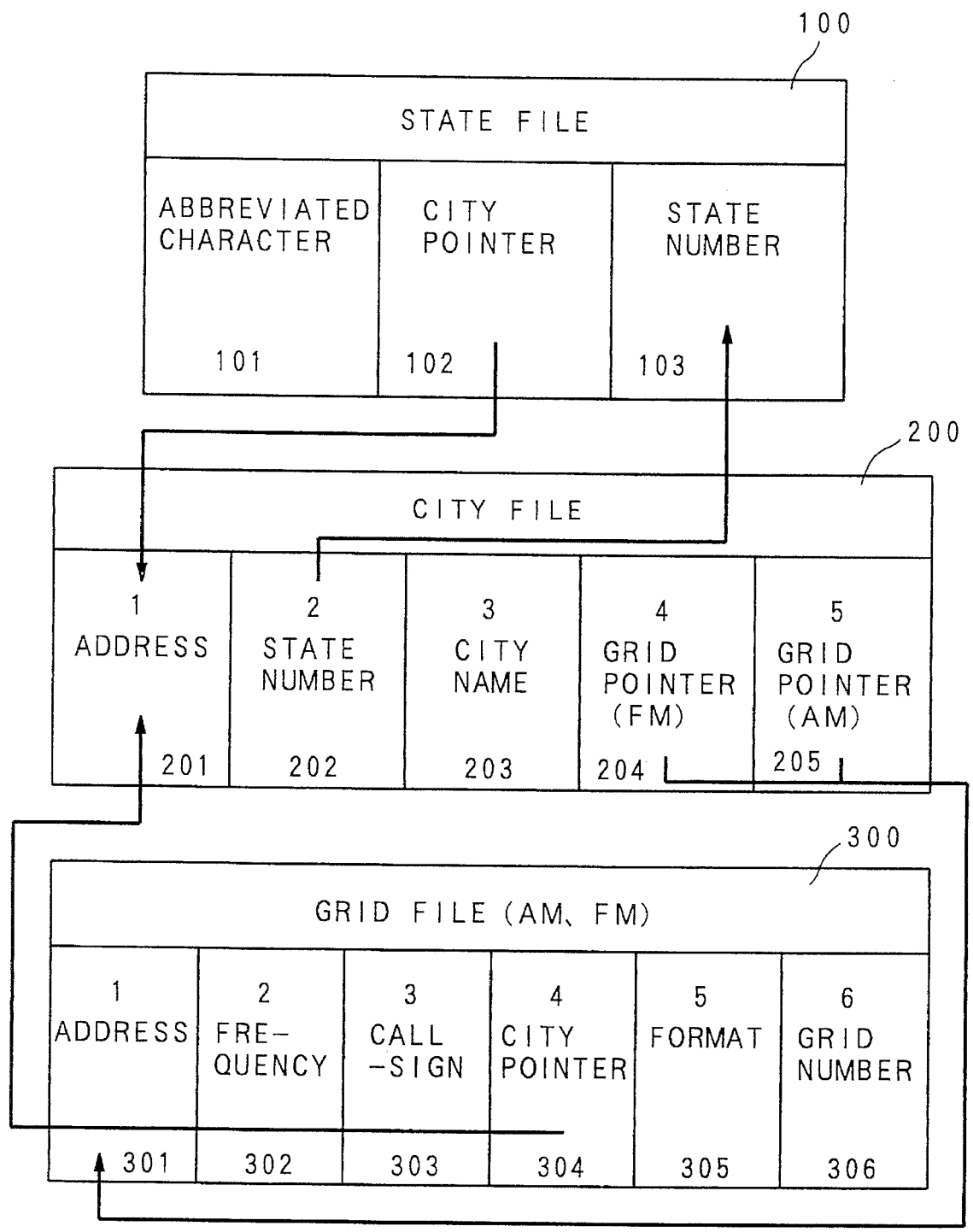
FIG. 4 is a diagram illustrating structure of database.

A database of format information relating to broadcasting stations is stored in the ROM of the memory circuit 8. FIG. 4 illustrates structure of the database. As illustrated, the database is of hierarchical structure. The upper class is state file 100 for storing state information for every states. A state file 100 includes abbreviated state-name field 101 representing a state by abbreviated two characters, city pointer field 102 representing city pointer which indicates head address of city file 200 storing information relating to cities in the state, and state-number field 103 representing state number allocated to the state. The city file 200 includes address field 201 storing address of the cities in the state, state-number field 202 indicating state-number of the state including cities corresponding to the addresses of the address field 201, city-name field 203 for storing names of cities covered by the database, and grid pointers 204 and 205 for determining addresses of grid file 300 storing station information of the cities. The grid file 300 stores information relating to broadcasting stations within the grid. The addresses specified by the grid pointers 204 and 205 in the city file 200 are head addresses of station information within the grid. The grid file 300 includes frequency field 302 designating frequencies of stations within the grid, call-sign field 303 indicating call-sign of the station, city-pointer field 304 representing point address of the city file 200, format field 305 for storing format information such as music genre, etc. of the station, a grid number field 306 defining grid information of grid to which the station belongs. These files can be modified to suit any countries or districts by changing the contents of the ROM.

Figures 5, 7:
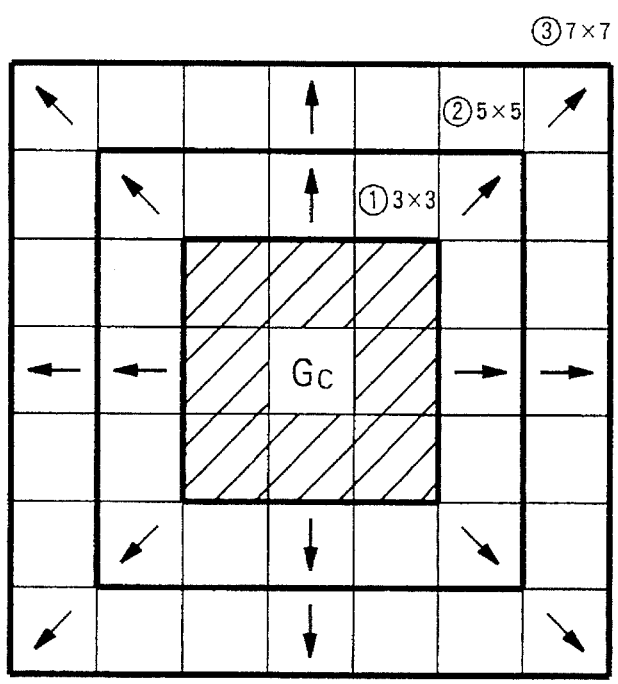
FIG. 5 is a diagram illustrating an example of grid matrix.
FIG. 7 is a diagram illustrating manner of grid matrix enlargement.

Next, an operation of the receiver will be described. At first, a format scan will be described. The format scan is an operation for searching for desired station in response to users designation of format information. First, user instructs format scan using the operation unit 11. For example, in order to listen to Rock music, user designates format information "ROCK" which indicates program of rock or disco music. The CPU 7 receives this instruction and accesses to the format field 305 of the memory circuit 8. In order to perform format scan efficiently, it is necessary to search for a station near enough to the current position of the vehicle and tries to receive signal therefrom. Therefore, the CPU 7 defines a square search area (hereinafter referred to as "grid matrix") of grids having a predetermined size in such a manner that the current grid is positioned at their center, and carries out format scan within the grid matrix. FIG. 5 illustrates an example of grid matrix. FIG. 5 shows a 3×3 matrix having lengths of 3 grids in both east-west and north-south directions. The CPU 7 defines current grid $G_C$ as a grid in which the vehicle is located, and carries out format scan within the current grid and then the grids surrounding the current grid $G_C$. A grid inherently has a grid number indicating absolute address. It is defined in the grid number field 306 in the grid file 300 of the memory circuit 8. However, format scan is carried out for the current grid and its surroundings, and therefore it is necessary to access to grids based on relative positional relation of the grids. For example, the grid $G_E$ is accessed in scanning in east direction from the current grid $G_C$ and the grid $G_{SW}$ is accessed in scanning in south-west direction from the current grid $G_C$. This grid matrix indicating relative position is stored in the RAM 10. Normally, format scan is performed on the current grid $G_C$. However, format scan is also carried out on surrounding 8 grids when renewal of current grid is needed due to deterioration of signal receiving condition. The following description is based on the premise that the current grid is correctly determined to the position where the receiver is present.

Normally, format scan is carried out for stations within the current grid $G_C$. The CPU 7 refers to the grid pointer corresponding to the current grid $G_C$ in the grid matrix stored in the RAM 10, and reads out a grid file 300 corresponding to the current grid $G_C$. By reading out the grid file 300, a head address of the address field 301 is obtained. The CPU 7 examines information of the station corresponding to the head address and continues scanning the grid file 300 until format of the format field 305 coincides with the format "ROCK" set by the user. When the coincidence is confirmed, the CPU 7 reads out information relating to the station (e.g., frequency, call-sign, etc.) from respective fields and represents them on the display unit 9. Simultaneously, the CPU 7 sets the phase-lock frequency to the PLL circuit 6 on the basis of the frequency information. In this way, user can tune to the station broadcasting information of desired format by format scan.

Figure 3A:
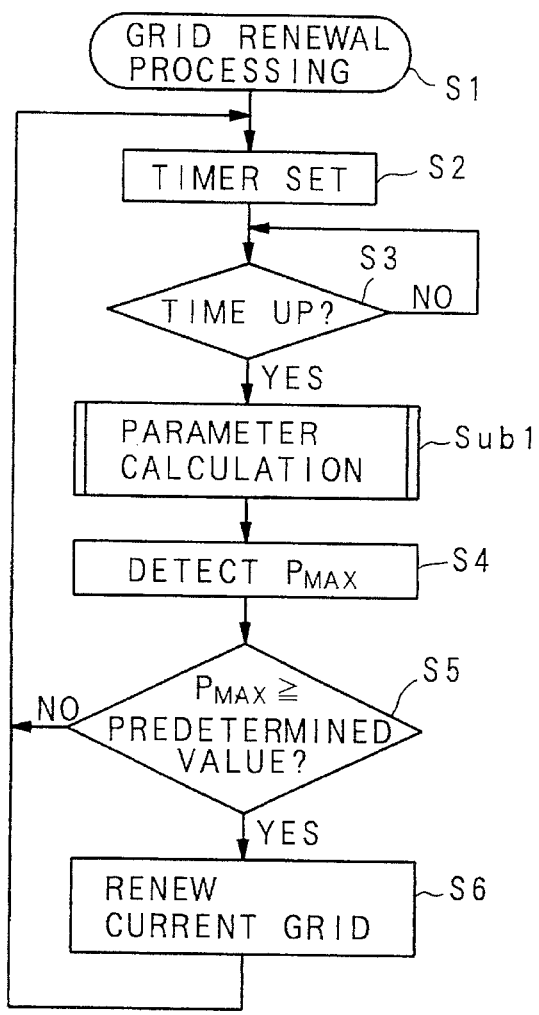
FIG. 3A is a flowchart illustrating a main routine of grid renewal processing according to the first embodiment.
Figure 3B:
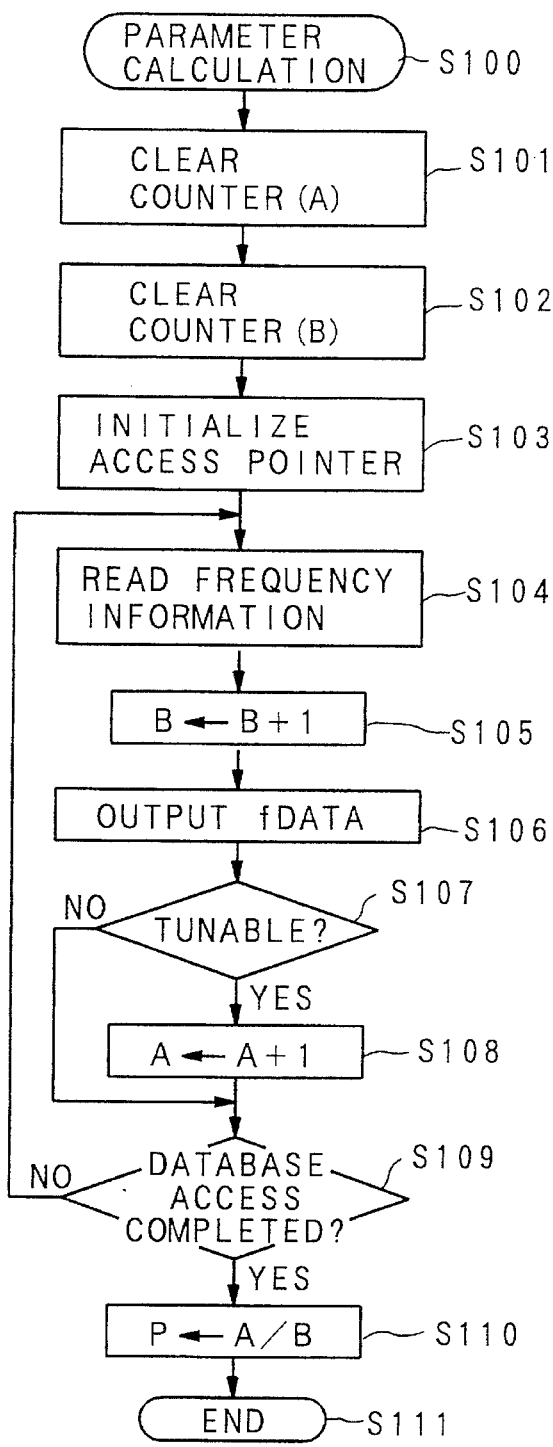
FIG. 3B is a flowchart illustrating a sub-routine of the main routine shown in FIG. 3A.

Next, grid renewal processing will be described with reference to FIGS. 3A and 3B. FIGS. 3A and 3B are flowcharts illustrating operation of grid renewal processing according to this embodiment. When power is supplied to the receiver, the CPU 7 reads out a program from the memory circuit 8 and executes it. FIG. 3A shows main routine of the program. In an initial setting, the CPU 7 notifies reception frequency previously used to the PLL 6 by reading it out from the memory circuit 8 or notifies an initial reception frequency determined in advance to the PLL 6. Then, the CPU 7 starts receiving signal of the frequency. After the initial setting, the CPU 7 returns to normal mode and starts grid renewal processing (step S1). Firstly, a timer is set (step S2). This timer decides a start timing of the grid renewal processing according to the present invention. The timer may be set to a time period decided in consideration of moving speed of vehicle, or may be arbitrarily set to a time period of certain minutes. While the timer is counting, the CPU 7 carries out other operation such as format scan described above. For example, when user manipulates the operation unit 11 to instruct format scan, the CPU 7 gives priority to the instruction and executes the above described format scan by interruption operation.

When the timer counts up to the time set in step S2, grid renewal processing is started. Grid renewal processing described below is required when signal receiving condition of receiver installed in a vehicle varies due to movement of the vehicle. When the timer counts up to the setting time (step S3:YES), grid renewal processing commences. First, parameter calculation is performed for 9 grids in the 3×3 grid matrix (step Sub1). The CPU 7 carries out this calculation by sub-routine operation. Namely, the CPU 7 executes operation of the sub-routine Sub1 for each of the 9 grids in the grid matrix (i.e., 9 times in total) to obtain parameters of the 9 grids. FIG. 3B is a flowchart illustrating the parameter calculation routine Sub 1. In this routine, a station number counter $C_A$ for counting number A of tunable stations within a target grid (i.e., one of the 9 grids in the grid matrix) is cleared firstly (step S101). Then, station number counter $C_B$ for counting total number B of stations in the target grid is also cleared (step S102). Then, an access pointer for accessing to information of the station is initialized, that is, set to an address specifying information relating to first station (step S103). Subsequently, the CPU 7 reads out, from the frequency field 302, frequency information relating to information in the grid file 300 specified by the access pointer, and sets the frequency of the PLL circuit 6 to the frequency (step S104). Further, the CPU 7 sets address of next station to the access pointer, and increments the station number B (step S105). The PLL circuit 6 receives first frequency information (step S106), and the electronic tuner 2 is set to the first frequency to receive electric wave from the first station. The tune judgement circuit 12 outputs valid judgement signal (e.g., "H" level) indicating that signal from the station can be appropriately received when the output level of the electronic tuner 2 is larger than a given level and level of the IF signal exceeds a given level. On the other hand, when the signals do not exceeds the respective given levels due to weakened received electric wave, the tune judgement circuit 12 outputs invalid judgement signal (e.g., "L" level) indicating that signal from the first station cannot be appropriately received. The given levels are determined by measurement in consideration of characteristics of devices used in the receiver. Then, the CPU 7 receives the judgement signal and recognizes whether signal is appropriately received or not (step S107). Only when the signal is received (step S107:YES), the station number A is incremented (step S108). Then, the CPU 7 accesses remaining area of database (step S108). If there remain other stations to be tuned in the target grid (step S109:NO), the operation 3umps back to step S104 and the CPU 7 tries to receive electric wave from the remaining stations. When database access is completed (step S109), the CPU 7 calculates parameter value P (=A/B) by dividing the station number A by the station number B and then begins processing for next grid (step S111). When parameters P are calculated for all 9 grids in the grid matrix, maximum one of them is detected (step S4). The maximum parameter $P_{MAX}$ obtained represents a grid where intensity of received electric wave is largest, and it may be judged as a grid where the vehicle is actually present. In this view, when the maximum parameter $P_{MAX}$ is larger than a predetermined value (step S5:YES), the grid corresponding to the maximum parameter $P_{MAX}$ is determined as correct current grid, and the current grid is renewed to the grid having maximum parameter value $P_{MAX}$. Then, the grid matrix is renewed to the grids including the renewed current grid at the center (step S6). When the maximum parameter $P_{MAX}$ is smaller than the predetermined value (step S5:NO), it is judged that current grid is correct but the signal receiving condition is simply irregular at that time for some reasons (e.g., the vehicle is travelling through a tunnel), and current grid is not renewed.

As described above, according to the first embodiment, current grid can be accurately renewed, during movement of the vehicle, using the parameter which represents signal receiving condition of the area of a grid where the vehicle is present. In addition, since current grid is renewed to a grid in best signal receiving condition, format scan is carried out in a grid in best condition. Therefore, user is not needed to renew current grid by himself, and operation may be simplified. Further, when a ratio of number of tunable stations in a grid to total number of stations in the grid is used as parameter for judging signal receiving condition, current grid is correctly renewed.

2nd Embodiment:

The parameter calculating method of the first embodiment is effective when relatively large number of stations exist in an area around the vehicle position. However, it has a problem when the vehicle is travelling an area where density of station is relatively low (e.g., mountains or wooded region). For example, if there exist grids including only one station, the parameter calculated by the method of the first embodiment is equal to maximum value "1" when signal from the unique station is received, and the parameter is equal to minimum value "0" when signal from the unique station is not received. As a result, when current grid is renewed only based on whether signal can be received or not, current grid may be erroneously renewed because number of samples to be examined is too small. In this view, according to the second embodiment, current grid is discriminated on the basis of the variation of parameter P.

Figure 6A:
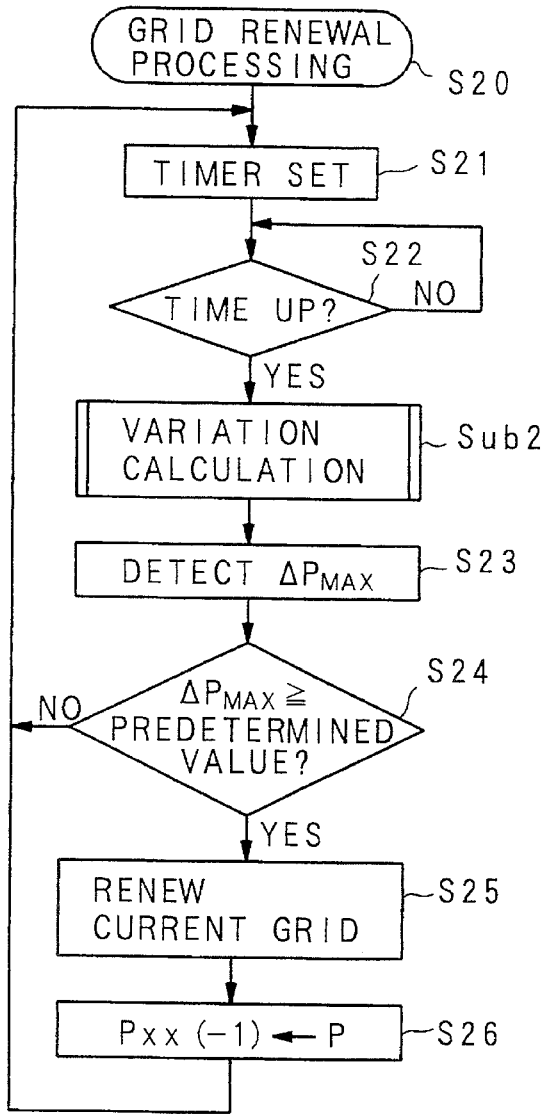
FIG. 6A is a flowchart illustrating a main-routine of grid renewal processing according to the second embodiment.
Figure 6B:
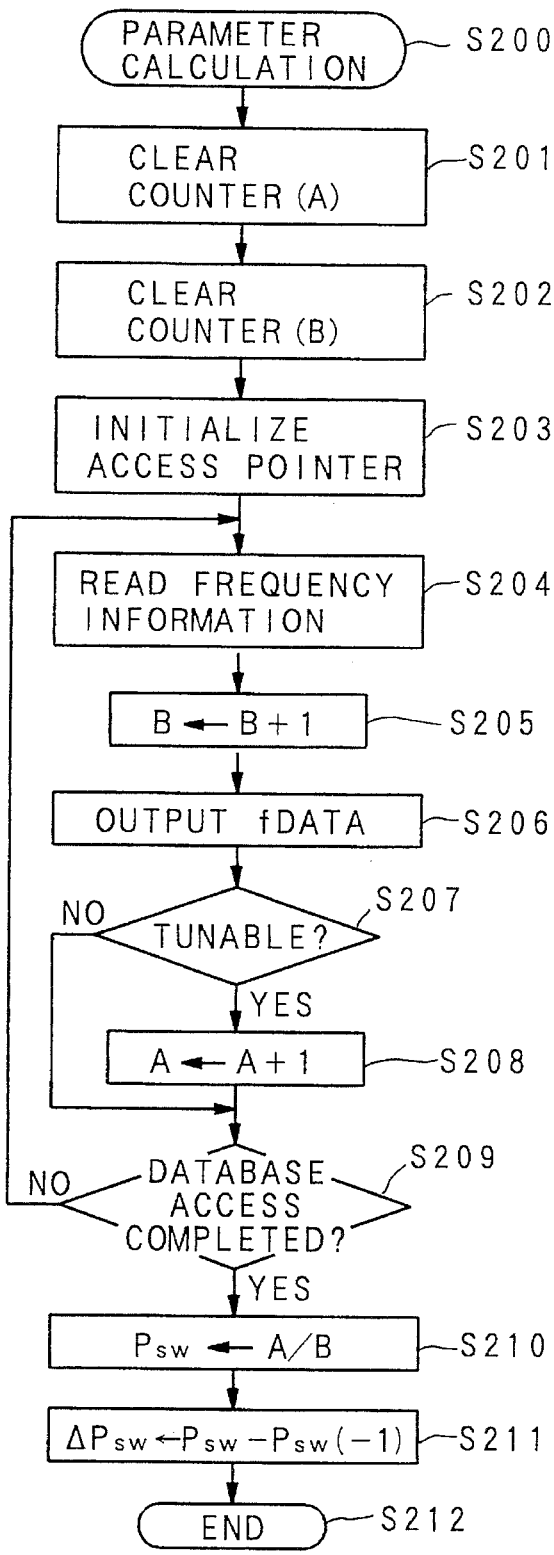
FIG. 6B is a flowchart illustrating a sub-routine of the main routine shown in FIG. 6A.

A construction of the auto-tuning receiver according to the second embodiment is identical to that of the first embodiment and therefore description thereof will be omitted. An operation of the auto-tuning receiver according to this embodiment will be described below with reference to FIGS. 6A and 6B. FIG. 6A is a flowchart illustrating main-routine of the operation. The operations of timer setting (step S21) and time counting (step S22) are identical to those (steps S1–S3) shown in FIG. 3A. In variation calculating step Sub2 subsequent to them, the CPU 7 calculates variations ΔP of parameters P for the 9 grids in the grid matrix. FIG. 6B illustrates sub-routine performing this calculation. The following description is directed at a case where signal receiving condition is examined for the grid $G_{SW}$ located on south-west direction of the current grid $G_C$. Operations of steps S201–S209 are identical to those of steps S101–S109 in FIG. 3B, and therefore description thereof will be omitted. This sub-routine Sub2 is different from the sub-routine Sub1 shown in FIG. 3B in value to be finally obtained. Namely, in this embodiment, the CPU 7 calculates parameter $P_{SW}$ by dividing the tunable station number A by the total station number B in the grid $G_{SW}$ in step S210, and sets the calculated value as present parameter value $P_{SW}$. Then, the CPU 7 calculates difference between the present parameter value $P_{SW}$ and last parameter value $P_{SW}(-1)$ as follows:

$$\Delta P = P_{SW} - P_{SW}(-1).$$

Thus, variation ΔP of the parameter value P is obtained (step S211). In this manner, the CPU 7 calculates variations ΔP of the 9 grids in the grid matrix. Then operation returns to the main routine, and the CPU 7 detects maximum variation $\Delta P_{MAX}$ from the variations ΔP thus calculated (step S23). When the maximum variation $\Delta P_{MAX}$ is larger than a predetermined value (>0) (step S24:YES), the CPU changes the current grid to the grid having the largest variation $\Delta P_{MAX}$ (step S25). Then, the CPU 7 stores the variations ΔP of each of the 9 grids in the RAM 10 as last variation values ΔP(−1) to be used in subsequent operation (i.e., ΔP(−1)=ΔP) (step S26). Using the variation ΔP of parameter P, the following can be said. When the variation is larger than zero, number of tunable stations from which signal can be received is increasing, that is, the vehicle is approaching the correct grid in which the vehicle is actually located. When the variation is equal to zero, the signal receiving condition is not changing. Accordingly, actual position of the auto-tuning receiver (i.e., vehicle) can accurately be in the current grid when the current grid is renewed to the grid having maximum variation ΔP. This may be recognized from by the relation that electric field intensity is inversely proportional to a square of distance. Namely, as the vehicle approaches a certain area, electric field intensity detected for an electric wave rapidly increases, and number of tunable stations correspondingly increases. In this view, it is proper that the grid having maximum variation is positioned nearest to the actual position of the vehicle.

As described above, according to the second embodiment, since the variation of the ratio of number of tunable stations in a grid to total number of stations is used as parameter, current grid in best condition can be detected. Therefore, current grid is correctly renewed even in a region where few number of stations exist, thereby enabling the current grid of the receiver to accurately follow the movement of the vehicle.

3rd Embodiment:

The first and second embodiments described above operate satisfactorily under such a condition that current grid initially set is correctly coincident with the actual current position of the vehicle. However, when user drives the vehicle for a long distance with power supply of the auto-tuning receiver remained power-off, current grid initially set immediately after power-on of the receiver is largely deviated from actual position of the vehicle. This may frequently happen in actual use of car-radio. In this case, the current grid is so deviated from the actual position of vehicle that the maximum parameter calculated cannot approach and reach the predetermined level defined for current grid renewal, and therefore the receiver may keep on receiving signal from distant station under poor signal receiving condition. In this view, in the third embodiment, area to be searched, that is, size of the grid matrix is appropriately changed so as to avoid erroneous setting of the current grid by initializing operation.

Figure 8:
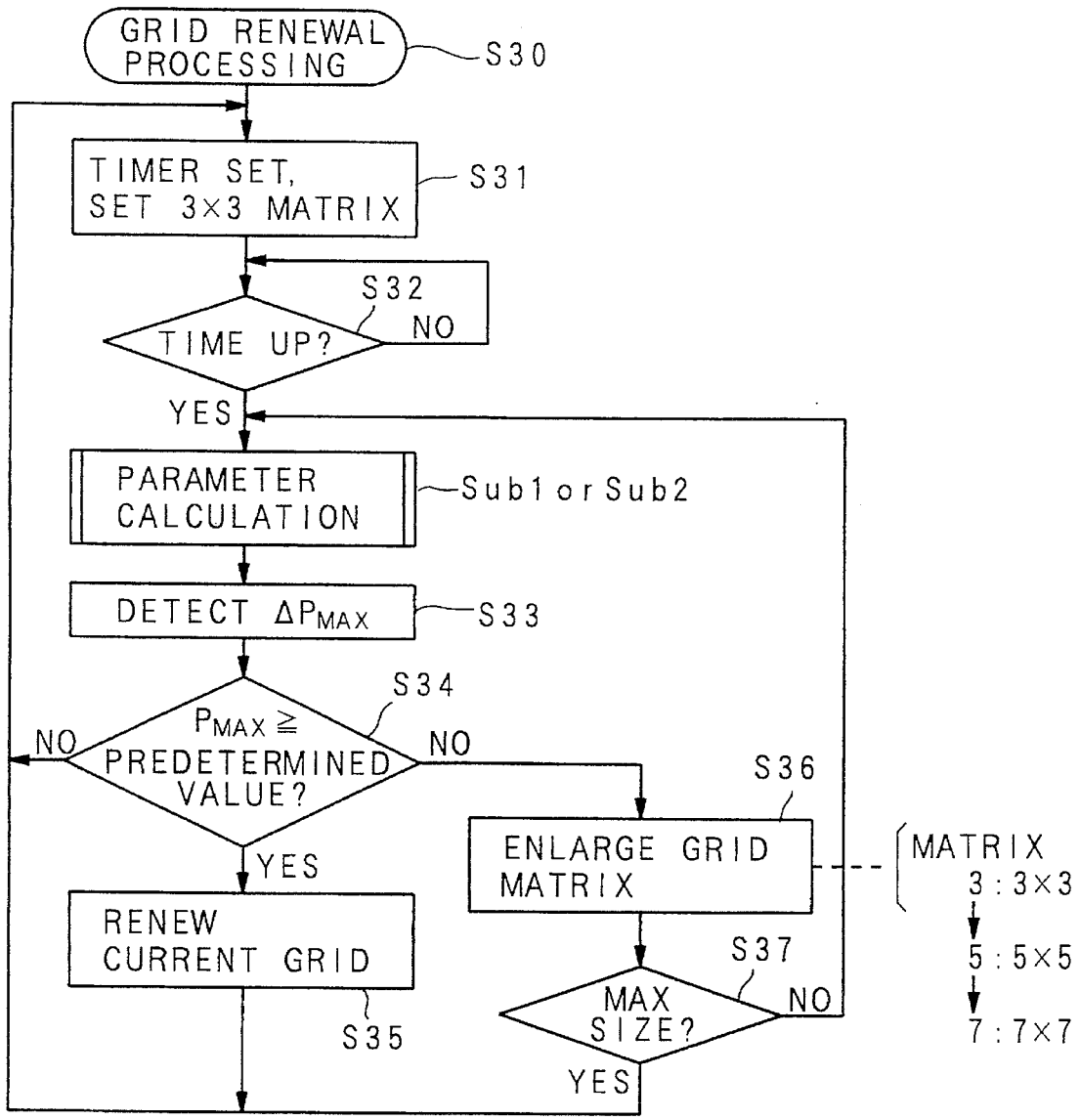
FIG. 8 is a flowchart illustrating a routine of grid renewal processing according to the third embodiment.

The construction of the receiver according to this embodiment is identical to that shown in FIG. 2, and therefore description thereof will be omitted. An operation of the third embodiment will be described with reference to FIG. 8. The CPU 7 sets the timer and initially sets grid matrix of 3×3 constitution in which parameter calculations are carried out (see. FIG. 7, oblique line portion). Then, the CPU 7 reads pointers of eight grids surrounding the current grid $G_C$ as well as the pointer of the current grid $G_C$, and stores them in the RAM 10 (step S31). Then, the time counting begins, and when the timer counts up to the counting time set (step S32:YES), calculation of parameters is started (step Sub1 or Sub2). This parameter calculation may be according to either one of the methods of the first embodiment and the second embodiment. Then, maximum parameter value $P_{MAX}$ or $\Delta P_{MAX}$ out of 9 parameters thus calculated is selected (step S33), and it is judged whether the maximum parameter value $P_{MAX}$ or $\Delta P_{MAX}$ is larger than a predetermined value or not (step S34). When the maximum parameter value is lager than the predetermined value (step S34:YES), current grid is renewed (step S35). When the maximum parameter value is smaller than the predetermined value (step S34:NO), grid matrix is enlarged. Namely, the CPU 7 enlarges the grid matrix for one grid in each of the north, south, east and west directions to produce a 5×5 grid matrix, and prepares 25 grid pointers assigned to the 25 grids (step S36). If the grid matrix thus enlarged extends beyond the region stored in the database (step S37:YES), it is judged that the vehicle has gone beyond followable region of the receiver and been in different region or country. In this case user is required to instruct correct city name by the operation unit 11 or change the ROM to store another database of new country or region in the memory circuit 8. If the grid matrix can be further enlarged (step S37:NO), parameter calculation is carried out for 16 (=25−9) grids within the enlarged 5×5 grid matrix other than the initial 3×3 grid matrix (step Sub1 or Sub2). When the current grid cannot be renewed within the enlarged 5×5 grid matrix (step S34:NO), parameter calculation is carried out for 24 (=7×7−25) grids within a further enlarged 7×7 grid matrix other than the 5×5 grid matrix. This operation is repeated until the current grid is renewed (step S34:YES) or grid matrix becomes maximum size (step S37:YES).

As described above, according to the third embodiment, parameter calculation is started with a grid matrix of initial size, and the grid matrix is enlarged when the current grid cannot be correctly renewed within the grid matrix. Namely, when the current grid is largely deviates from actual position of vehicle, current grid is searched from narrow area to surrounding wider area. Therefore, current grid can be rapidly searched for in a large extent and correct current grid may be efficiently detected. In the above description, the search area defined by the grid matrix is square area, however, it may be another form such as circular area.

4the Embodiment:

In the fourth embodiment, signal receiving condition is not judged only based on parameter value. Namely, electric field intensity of grid is used as additional parameter and signal receiving condition is judged in consideration of both the parameter value and the electric field intensity which indicates absolute signal receiving condition.

Figure 9:
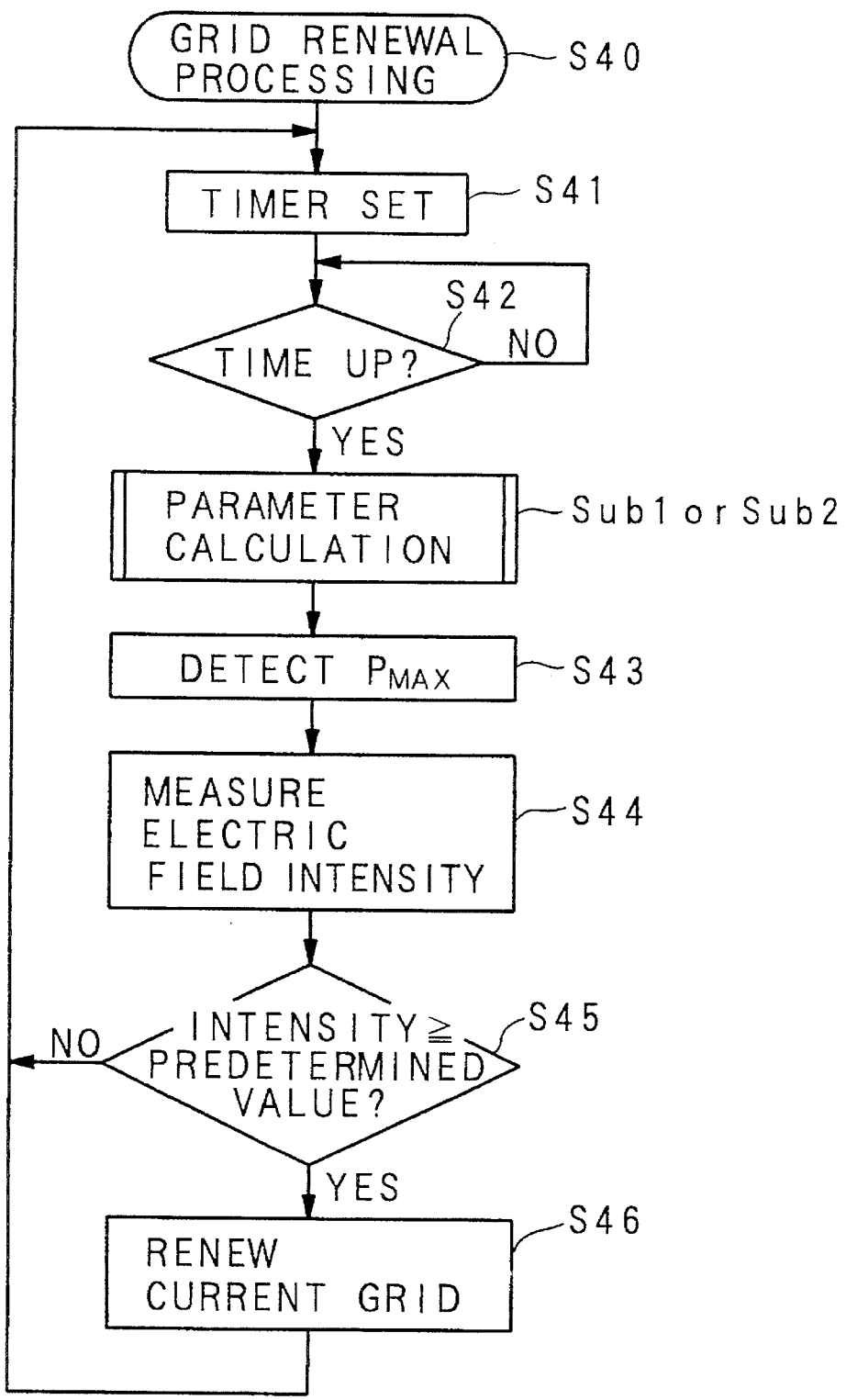
FIG. 9 is a flowchart illustrating a routine of grid renewal processing according to the fourth embodiment.

The construction of the receiver of this embodiment is identical to that shown in FIG. 2, and therefore description thereof will be omitted. It is noted, however, that the tune judgement circuit 12 supplies, to the CPU 7, not only the judgement signal but also A/D-converted DC level of IF signal supplied from AGC circuit. An operation of the fourth embodiment will be described with reference to FIG. 9. The CPU 7 performs time counting (step S41 and S42), and starts parameter calculation after a predetermined time is counted by the timer (step Sub1 or Sub2). When parameters are calculated for all grids in the search area (i.e., grid matrix), the CPU 7 selects maximum parameter value (step S43) and then starts measurement of electric field intensity of stations in the grid having the maximum parameter value (step S44). Then, the CPU 7 reads out grid file 300 of the grid from the memory circuit 8, and reads out frequency data from the frequency field 302 of station registered in the grid field. The frequency read out is set to the PLL circuit 6, and signal of the frequency is received by the electronic tuner 2. The tune judgement circuit 12 detects D.C. component of IF signal proportional to electric field intensity by low-pass-filter, detector, etc., and supplies to the CPU 7 after A/D conversion. Accordingly, the CPU 7 can directly measure electric field intensity of received signal. This measurement of the electric field intensity may be performed for all stations within the grid or may be performed for some of the stations within the grid. When the electric field intensity thus measured is larger than a predetermined value set by program (step S45:YES), current grid is renewed (step S46). On the other hand, when the electric field intensity is smaller than the predetermined value (step S45:NO), renewal of the current grid is inhibited and next stage of grid renewal processing is performed from the start (step S41). The predetermined value set in the CPU 7 is decided according to measurement so that the current grid is renewed when the received signal has sufficient electric field intensity.

As described above, according to the fourth embodiment, actual electric field intensity is additionally used as parameter for judging signal receiving condition. Therefore, the current grid is not erroneously and vainly renewed in tunnel or mountains where electric field intensity is markedly small. In addition, format scan may be inhibited in area where judgement of signal receiving condition is ineffective. Namely, by detecting electric field intensity, grids in unfavorable signal receiving condition may be correctly detected and eliminated from objects of current grid renewal, thereby improving reliability of tuning operation.

In the above description, the CPU 7 judges signal receiving condition by directly reading the A/D converted absolute value of electric field intensity. However, the tune judgement circuit 12 may include, in place of the A/D converter, a comparator for comparing a predetermined reference voltage with a voltage corresponding to the measured intensity value. In this case, the predetermined value (step S45) to be compared may be a reference voltage set by varying resistance of variable resistor.

Figures 10, 12:
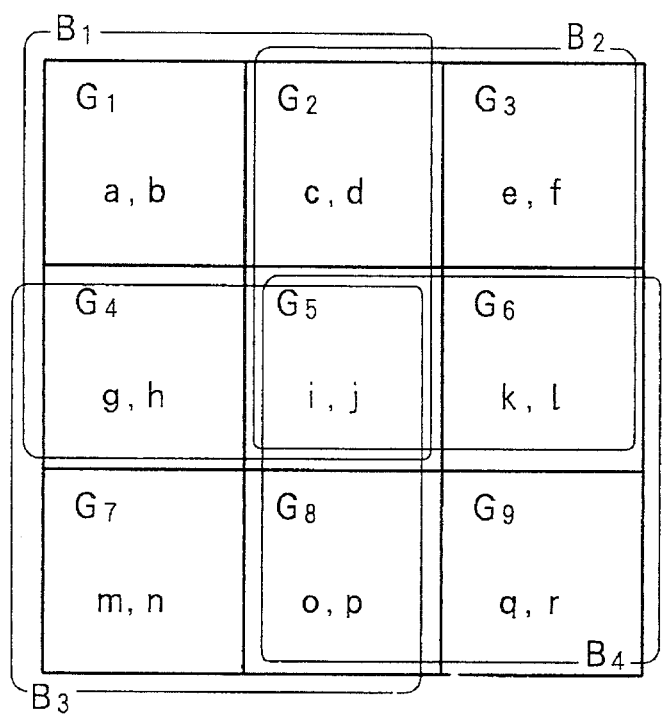
FIG. 10 is a diagram illustrating a case where the auto-tuning receiver according to the fifth embodiment is applied.
FIG. 12 is a diagram illustrating a case where the auto-tuning receiver according to the sixth embodiment is applied.

5th Embodiment:

The fifth embodiment improves accuracy of current grid renewal by the auto-tuning receiver according to the present invention. An auto-tuning receiver according to this embodiment has the same construction as that of the first embodiment shown in FIG. 2, and therefore detailed description thereof will be omitted. In case of calculating the parameters (representative of reception probability) and judging signal receiving conditions for each grids separately, a problem may possibly occur. This will be described below. FIG. 10 is a diagram illustrating a case where the auto-tuning receiver according to the fifth embodiment effectively functions. In the case of FIG. 10, the search area of the auto-tuning receiver is an area of $G_1$–$G_4$, stations a to e exist in grid $G_1$, stations f and g exist in grid $G_2$, stations h and i exist in grid $G_3$, and stations j and k exist in grid $G_4$. It is assumed that current grid of the auto-tuning receiver is the grid $G_1$. Now, it is assumed that only three stations d, e and j are tunable from the current position of the receiver due to some geographical reasons. In this case, parameter $P_i$ representing reception probabilities of the grid $G_i$ is calculated by the following equation:

$$P_i=\text{(number of tunable stations in the grid } G_i\text{)/(total number of stations within the grid } G_i\text{) [\%]}.$$

According to this equation, parameters $P_1$–$P_4$ of the grids $G_1$–$G_4$ are calculated as follows:

$P_1$=2/5=40 [%] (stations d and e are tunable), $P_2$=0/2=0 [%] (no tunable station), $P_3$=0/2=0 [%], (no tunable station) and $P_4$=1/2=20 [%] (station j is tunable).

According to this result, the current grid will be nextly renewed to the grid $G_4$ which has maximum parameter value. However, it is improper. In this case, if the grid $G_1$ has three tunable stations, the parameter $P_1$=3/5=60 [%] becomes maximum and current grid is correctly renewed to the grid $G_1$. Accordingly, there is no problem because current grid is renewed to a grid under best receiving condition. However, in the above calculated case, current grid is erroneously renewed to the grid $G_4$ which is not necessarily in best receiving condition. As demonstrated, in a case where few stations are present in a grid and signal receiving condition is relatively poor, variation of signal receiving condition of only one station affects the parameter value too greatly. Therefore, current grid may be renewed to wrong one. The above problem occurs when reception probability (i.e., parameter) is calculated using few samples (i.e., stations).

In this view, according to this embodiment, the parameter is calculated by dividing the number of tunable stations by not the number of stations within the grid but total number of all tunable stations in the search area (e.g., all grids in the grid matrix) at that time. When the parameters $P_i'$ for the grid $G_i$ is calculated using the total number of all tunable stations as divisor, the parameter $P_i'$ is calculated by the following equation:

$P_i'$=(number of tunable stations in a grid)/(total number of tunable stations in the area) [%].

According to this equation, parameters $P_1'$–$P_4'$ of the grids $G_1$–$G_4$ are calculated as follows (tunable stations are d, e and j, and total number of tunable station in the search area is 3):

$P_1'$=2/3=66 [%] (stations d and e are tunable), $P_2'$=0/3=0 [%] (no tunable station), $P_3'$=0/3=0 [%], (no tunable station) and $P_4'$=1/3=33 [%] (station j is tunable). As seen from this result, the current grid will be correctly renewed to the grid $G_1$ which has maximum parameter value and in best signal receiving condition.

Figure 11:
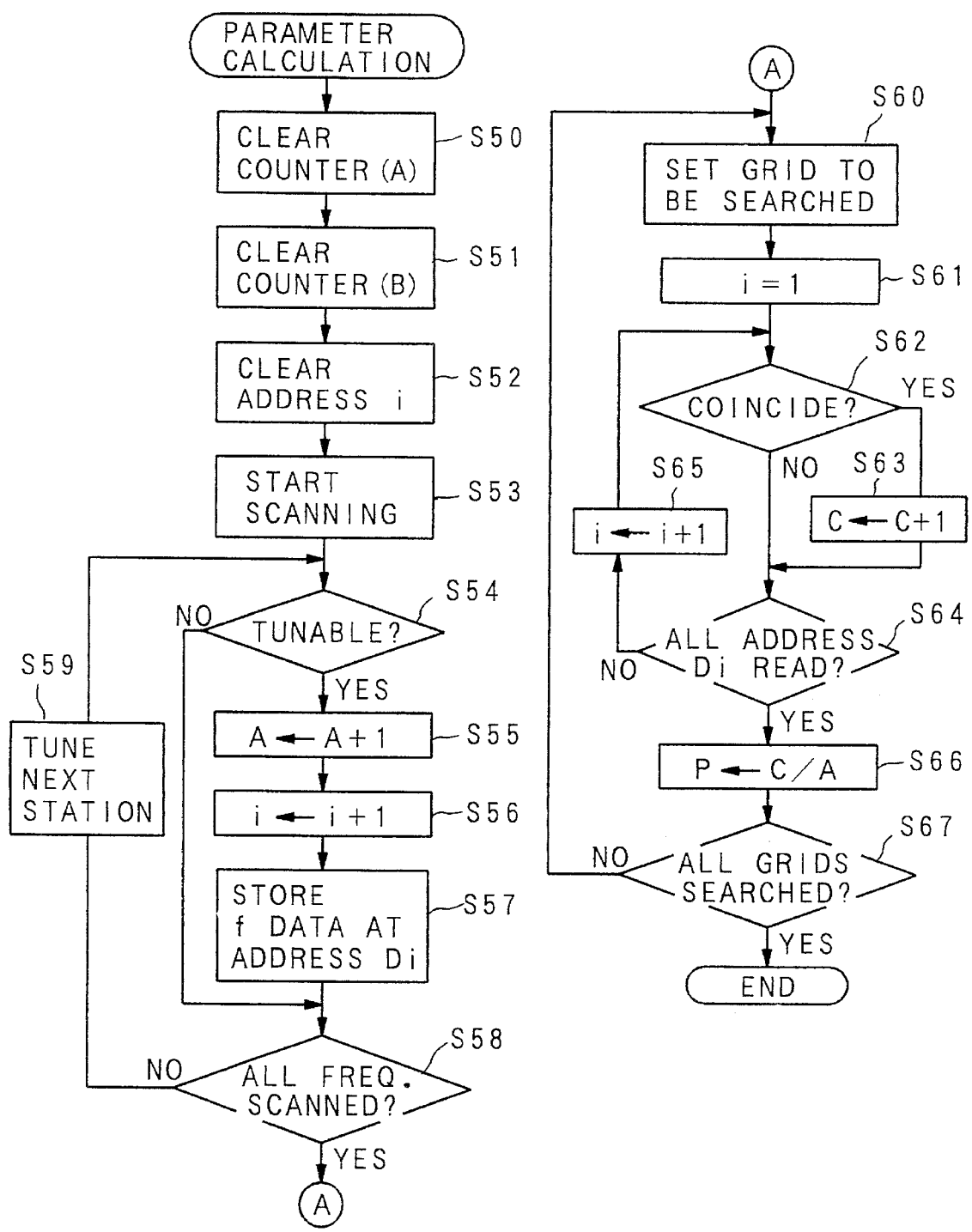
FIG. 11 is a flowchart illustrating an operation of auto-tuning receiver according to the fifth embodiment.

Processing of this embodiment is performed basically along the main routine shown in FIG. 3A. However, according to this embodiment, parameter calculation processing shown in FIG. 11 will be carried out, at the step Sub1 of the routine shown in FIG. 3A, in stead of the routine of FIG. 3B. In the parameter calculation routine shown in FIG. 11, the CPU 7 firstly clears the station number counter $C_A$ for calculating number of A tunable stations in a target grid (step S50). Then, the CPU 7 clears station number counter $C_C$ for counting total number C of tunable stations within the search area (step S51). Then, the CPU 7 clears the address of the frequency information f stored in the grid file 300 specified by the access pointer, and sets frequency information of stations within grids surrounding the current grid (i.e., within current grid matrix) (step S52). After these preparations are completed, search of tunable stations is started (step S53). Namely, first frequency information f is read out from the address and is supplied to the PLL circuit 6. The electronic tuner 2 set to the frequency receives signal corresponding to the frequency from the antenna 1. Then, tune judgement circuit 12 outputs judgement signal indicating whether signal of the frequency can be received or not (step S54). If signal is appropriately received (step S54:YES), the station number A is incremented (step S55), and address i of the frequency information f is incremented (step S56). Subsequently, the frequency information f is stored in the storage area $D_i$ (step S57). If step S57 ends or step S54 results in NO, the CPU 7 judges whether all frequencies of the stations are examined or not (step S58). If frequency information remains not examined yet (step S58:NO), the CPU tries to receive signals of the remaining frequencies (step S59). When all frequencies are examined (step S58:YES), the CPU 7 commences calculation of parameters. The CPU 7 sets a grid to be examined firstly, in order to examine how many tunable stations each grids contains. Then, the CPU 7 sets the address of frequency information to the address of first frequency (step S61). Then, the CPU 7 judges whether the first frequency information coincides with frequency information of tunable stations stored in the storage area $D_i$ or not (step S62). If the coincidence is confirmed (step S62:YES), the number C of the station counter $C_C$ is incremented (step S63). If the coincidence is not confirmed (step S62:NO), it is judged whether all addresses stored in the area $D_i$ are examined or not (step S64). If remaining data exist (step S64:NO), coincidence of next frequency information is examined (steps S62 and S63). When all frequency data are examined (step S64:YES), the station counter $C_C$ retains number C of tunable stations within the grid to be searched and the station counter $C_A$ retains total number A of tunable stations in the search area. Subsequently, the CPU 7 calculates parameters according to equation: P=C/A (step S66). The above operation of steps S60–S67 are repeated until parameters for all grids are calculated (step S67:NO). When examinations of all grids are completed (step S67:YES), the CPU 7 ends this routine and returns to the main routine (FIG. 3A, step S4).

It is noted that the concept of the second embodiment is applicable to this embodiment. Namely, by inserting a step for calculation: $\Delta P_{SW} = P_{SW} - P_{SW}(-1)$ after step S66 in FIG. 11, current grid can be renewed by referring to variation of parameters, thereby improving accuracy of determining current grid.

As described above, according to the fifth embodiment, the CPU 7 detects total number of tunable stations within current search area and calculates parameters using total number of tunable stations. Namely, relative signal receiving condition can be examined among tunable stations under a condition where few stations exist or signal receiving condition is relatively poor. Therefore, a grid in best signal receiving condition can be detected from good samples under relatively good signal receiving conditions even in a case where few stations can be tunable due to geographical reasons, such as being in valley between tall buildings or mountains. Therefore, renewal of current grid is accurately carried out.

6th Embodiment:

In the above described embodiments, parameter is calculated for each grids separately, however, in the 6th embodiment, parameter is calculated for groups of grids, each including a plurality of grids. The construction of the auto-tuning receiver according to this embodiment is identical to that of the first embodiment, and therefore description thereof will be omitted. FIG. 12 is a diagram illustrating grouping of grids according to this embodiment. In the following description, a group of grids including a plurality of grids will be simply referred to as "group". As shown in FIG. 12, it is assumed that there is a 3×3 matrix including 9 grids, and that stations a, b, . . . , r exist in the grids $G_1$–$G_9$. Now, it is assumed that current grid is the grid $G_5$ and grids $G_1$–$G_9$ will be examined, and that the stations a, c, h, i, j, q and r are tunable at present. When the parameter calculation similar to that of the fifth embodiment is carried out for this case, parameters $P_1$–$P_9$ of respective grids are as follows (7 tunable station exist):

$P_5$=2/7=28 [%] (stations i and j are tunable), $P_9$=2/7=28 [%] (stations q and r are tunable), $P_1$=$P_2$=$P_4$=1/7=14 [%], (station a, c and h are tunable ) and $P_3$=$P_6$=$P_7$=$P_8$=0/7=0 [%] (no station is tunable).

In this case, the parameters $P_5$ and $P_9$ represents equal reception probability and it is impossible to judge to which grids the current grid should be renewed. In order to overcome this problem this embodiment introduces "group" including a plurality of (e.g., 4) grids. For example, four groups $B_1$–$B_4$ are defined as shown in FIG. 12. As seen from FIG. 12, the group $B_1$ includes grids $G_1$, $G_2$, $G_4$ and $G_5$, the group $B_2$ includes grids $G_2$, $G_3$, $G_5$ and $G_6$, the group $B_3$ includes grids $G_4$, $G_5$, $G_7$ and $G_8$, and the group $B_4$ includes grids $G_5$, $G_6$, $G_8$ and $G_9$. When a ratio of number of tunable stations in the group to total number of tunable stations in the area (i.e., all groups) is calculated for each of the groups, like the fifth embodiment, the following results are obtained:

$P_1'$ (group $B_1$)=5/7=71 [%], $P_2'$ (group $B_2$)=3/7=42 [%],
$P_3'$ (group $B_3$)=3/7=42 [%], and
$P_4'$ (group $B_4$)=4/7=57 [%].

As described, according to this embodiment, parameters are calculated for groups including plural grids and one of the group in best signal receiving condition is selected (e.g., group $B_1$). Then, out of the grids in the selected group (i.e., group $B_1$), a grid in best signal receiving condition is selected (i.e., grid $G_5$). In this manner, erroneous renewal of current grid may be avoided. Further, in this embodiment, signal transmission band (e.g., AM or FM) is taken into consideration in decision of the groups, because distribution of tunable stations may be varied according to the modulation systems due to affection from directivity of transmission radio waves.

Figure 13:
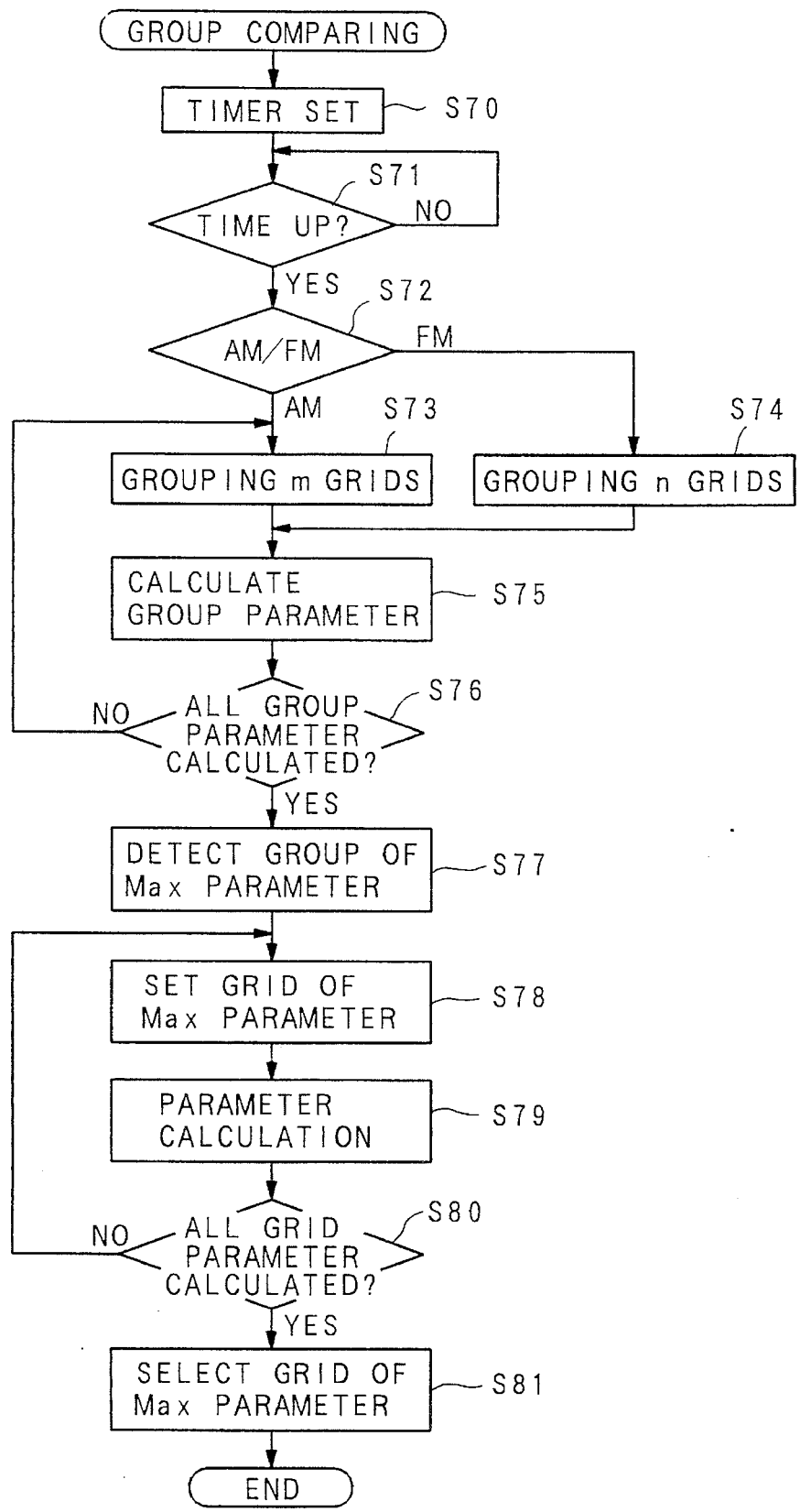
FIG. 13 is a flowchart illustrating an operation of auto-tuning receiver according to the sixth embodiment.

Next, operation this embodiment will be described in more detail with reference to FIG. 13. In FIG. 13, the CPU 7 firstly sets internal timer (step S70), and performs grid renewal periodically (step S71:YES). In grid renewal, firstly, reception band of radio wave is detected (step S72). When AM signal is received, groups each including m grids are set (step S73), and when FM signal is received, groups each including n grid are set (step S74). In step S75, tunable stations are searched using the groups set in steps S73 or S74, and the parameters for the groups are calculated. As a method of calculating parameters of groups, one of the methods of the first embodiment which calculates ratio of tunable station number to total tunable station number in the grid, the method of the second embodiment which calculates variation of the parameters and the method of the fifth embodiment which calculates a ratio of tunable station number in a grid to total number of tunable station in the search area may be used. In addition, the range of the grid to be examined may be enlarged to 5×5 or 7×7 matrix according to the third embodiment. Then, it is judged whether parameters are calculated for all groups or not (step S76). If there remains groups whose parameters are not calculated yet (step S76:NO), steps S72 to S76 are repeated. When parameters of all group are calculated (step S76:YES), a group having maximum parameter value is selected (step S77). Then, grids in the selected group are set (step S78), and parameter calculation for each rids in the selected group are carried out using one of the methods of the first, second or fifth embodiment (step S79). The parameter calculation of grids are repeated until parameters of all grids are obtained (step S80). Then, a grid having maximum parameter value is selected, and current grid is changed to the grid (step S81).

As described above, according to this embodiment, signal receiving condition is roughly checked for groups firstly and a group in best signal receiving condition is selected. Then each of the grids in the group in the best signal receiving condition are checked and a grid in best signal receiving condition is finally selected. Therefore, possibility of erroneous decision of current grid may be avoided. Particularly, in a case where some grids have the same parameter values, correct one of them can be identified because judgement of signal receiving condition by group unit is carried out prior to the examination of signal receiving conditions for each grids. Further, detailed examination of signal receiving condition is carried out only for the grids within the group in best signal receiving condition, it requires less steps from the start of search operation to the renewal of current grid, and current grid renewal can be rapidly completed. In this view, operation may be markedly simplified by this embodiment when current grid is detected from broad area, like the third embodiment of the present invention. Further, since the manner of grouping is varied in consideration of transmission frequency band of received signal, appropriate grouping of grids can be performed.

Other modifications:

The present invention may be modified in other various forms. For example, in the above described embodiment, time counting of grid processing is executed by counting operation of software. However, the time can be counted by an external hardware timer supplying counting result to the CPU 7. The grid renewal processing may be executed at every running distance measured by a known distance measuring device which detects driving speed pulses. Further, user's instruction, change of signal receiving condition, parameter of current grid or parameters of a few grids in favorable signal receiving condition are periodically monitored, and processing of the embodiments may be carried out when the parameters monitored becomes unsatisfactory.

Further, it is possible to eliminate multi-station from stations in processing. "Multi-station" is station using same frequency for signal transmission and is located in a plurality of grids. When the multi-station is present, high signal receiving probability is obtained in each of the grids. In addition, when the above processing for obtaining parameters are carried out stations including the multi-station, correct parameter calculation cannot be executed because plural electric waves having the same frequency exist on a single carrier wave. This may results in an erroneous judgement. In this case, a flag indicating multi-station is stored in database, and multi-station may be eliminated from objects of processing in step S104 of the first embodiment or step S204 of the second embodiment. By doing this, multi-station having plural stations on the same carrier frequency can be eliminated from stations object to the parameter calculation, and therefore signal receiving condition may be accurately detected.

The invention may be embodied on other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning an range of equivalency of the claims are therefore intended to be embraced therein.

What is claimed is:

1. A receiver with automatic tuning function comprising:
   means for dividing an area where broadcasting stations exist into a plurality of blocks and storing block information relating to the blocks;
   means for storing station information relating to each of the broadcasting stations located in the block in association with the block information of the block;
   means for storing block information of a current block and blocks surrounding the current block;
   means for selecting one of the plurality of broadcasting stations located in the current block by referring to the station information associated with the block information of the current block;
   means for receiving electric wave from the broadcasting station selected;
   means for judging a receiving condition of the electric wave and outputting a judgement signal, wherein said judging means calculates, for each of the blocks, a ratio of a number of tunable broadcasting stations, from which an electric wave can be received, in the block, to a total number of the broadcasting stations located in the block as a parameter value; and means for renewing the current block, comprising means for allowing said receiving means to receive electric waves from all of the broadcasting stations located in the current block and the surrounding blocks and allowing said judging means to output judgement signals for all of the broadcasting stations, said renewing means determines a block having largest parameter value as new current block; and means coupled to said judging means for detecting a block, out of the current block and the surrounding blocks, in best receiving condition based on the judgement signals and determining the block as new current block.

2. A receiver according to claim 1, wherein said judging means eliminates a plurality of broadcasting stations having identical frequencies in the current block and the surrounding blocks from calculation of the ratio.

3. A receiver with automatic tuning function comprising:

means for dividing an area where broadcasting stations exist into a plurality of blocks and storing block information relating to the blocks;

means for storing station information relating to each of the broadcasting stations located in the block in association with the block information of the block;

means for storing block information of a current block and blocks surrounding the current block;

means for selecting one of the plurality of broadcasting stations located in the current block by referring to the station information associated with the block information of the current block;

means for receiving electric waves from the broadcasting station selected;

means for judging a receiving condition of the electric wave and outputting a judgement signal; wherein said judging means calculates, for each of the blocks, a variation in time of a ratio of number of tunable broadcasting stations, from which an electric wave can be received, in the block, to total number of the broadcasting stations located in the block as a parameter value, and renewing means determines a block having largest parameter value as a new current block and said means for renewing the current block, comprising means for allowing said receiving means to receive electric waves from all of the broadcasting stations located in the current block and the surrounding blocks and allowing said judging means to output judgement signals for all of the broadcasting stations; and means coupled to said judging means for detecting a block, out of the current block and the surrounding blocks, in best receiving condition based on the judgement signals and determining the block as new current block.

4. A receiver according to claim 3, wherein said judging means eliminates a plurality of broadcasting stations having identical frequencies in the current block and the surrounding blocks from calculation of the ratio.

5. A receiver with automatic tuning function comprising:

means for dividing an area where broadcasting stations exist into a plurality of blocks and storing block information relating to the blocks;

means for storing station information relating to each of the broadcasting stations located in the block in association with the block information of the block;

means for storing block information of a current block and blocks surrounding the current block;

means for selecting one of the plurality of broadcasting stations located in the current block by referring to the station information associated with the block information of the current block;

means for receiving electric waves from the broadcasting station selected;

means for judging a receiving condition of the electric wave and outputting a judgement signal; wherein said judging means calculates, for each of the blocks, a ratio of number of tunable broadcasting stations, from which an electric wave can be received, located in the block, to a total number of the broadcasting stations located in the block and the surrounding blocks as a parameter value, and renewing means determines a block having largest parameter value as new current block; and said means for renewing the current block, comprising means for allowing said receiving means to receive electric waves from all of the broadcasting stations located in the current block and the surrounding blocks and allowing said judging means to output judgement signals for all of the broadcasting stations; and means coupled to said judging means for detecting a block, out of the current block and the surrounding blocks, in best receiving condition based on the judgement signals and determining the block as new current block.

* * * * *